(12) United States Patent
Steiner et al.

(10) Patent No.: US 8,724,387 B2
(45) Date of Patent: May 13, 2014

(54) METHOD, SYSTEM, AND COMPUTER READABLE MEDIUM FOR READING AND PROGRAMMING FLASH MEMORY CELLS USING MULTIPLE BIAS VOLTAGES

(75) Inventors: Avi Steiner, Kiryat Motzkin (IL); Hanan Weingarten, Herzelia (IL)

(73) Assignee: Densbits Technologies Ltd., Haifa (IL)

( * ) Notice: Subject to any disclaimer, the term of this patent is extended or adjusted under 35 U.S.C. 154(b) by 271 days.

(21) Appl. No.: 12/870,487

(22) Filed: Aug. 27, 2010

(65) Prior Publication Data

US 2011/0096612 A1    Apr. 28, 2011

Related U.S. Application Data

(60) Provisional application No. 61/253,917, filed on Oct. 22, 2009.

(51) Int. Cl.
*G11C 11/34* (2006.01)

(52) U.S. Cl.
USPC ............. 365/185.09; 365/185.03; 365/185.33

(58) Field of Classification Search
USPC ........................... 365/185.03, 185.09, 185.33
See application file for complete search history.

(56) References Cited

U.S. PATENT DOCUMENTS

| | | |
|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Ranjeet Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Morris et al. |
| 5,729,490 A | 3/1998 | Calligaro et al. |
| 5,740,395 A | 4/1998 | Wells et al. |

(Continued)

FOREIGN PATENT DOCUMENTS

WO    WO2009053963 A2    4/2009

OTHER PUBLICATIONS

Search Report of PCT Patent Application WO 2009/118720 A3.
Search Report of PCT Patent Application WO 2009/095902 A3.

(Continued)

*Primary Examiner* — Vanthu Nguyen
(74) *Attorney, Agent, or Firm* — Dentons US LLP

(57) ABSTRACT

A system, method and computer readable medium for programming and reading flash memory cells. Respective first and second read operations may be performed while supplying respective first and second bias voltage to multiple flash memory cells, to provide respective first and second read results, where the first bias voltage may be higher then the second bias voltage, and providing a read outcome that may be responsive to the first read results and to the second read results. A programming method may include performing first and second programming operations while supplying respective first and second bias voltages to multiple flash memory cells. The programming method may further include performing the first programming operation while programming information mapped to a highest least significant bit positive lobe, and performing the second programming operation while programming information mapped to at least one other least significant bit positive lobe.

28 Claims, 10 Drawing Sheets

(56) References Cited

U.S. PATENT DOCUMENTS

| | | |
|---|---|---|
| 5,745,418 A | 4/1998 | Hu et al. |
| 5,778,430 A | 7/1998 | Ish et al. |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B2 | 5/2012 | Yang et al. |
| 8,250,324 B2 | 8/2012 | Haas et al. |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,407,560 B2 | 3/2013 | Ordentlich et al. |
| 8,417,893 B2 | 4/2013 | Khmelnitsky et al. |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee et al. |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |

(56) References Cited

U.S. PATENT DOCUMENTS

| | | |
|---|---|---|
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir et al. |

OTHER PUBLICATIONS

Search Report of PCT Patent Application WO 2009/078006 A3.
Search Report of PCT Patent Application WO 2009/074979 A3.

(56) References Cited

OTHER PUBLICATIONS

Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, Volume: 2, pp.: II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips. com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique,", Ieee Transactions On Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
Jedec Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., " Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.
Cappelletti, Paulo et al.; Flash Memories; pp. 104-107.

METHOD, SYSTEM, AND COMPUTER READABLE MEDIUM FOR READING AND PROGRAMMING FLASH MEMORY CELLS USING MULTIPLE BIAS VOLTAGES

CLAIM OF PRIORITY

This application claims the benefit of priority, under 35 U.S.C. §119(e), of U.S. Provisional Application No. 61/253,917, titled "Systems and Method for Utilizing a Flash Memory," and filed Oct. 22, 2009, the entire contents of which is incorporated herein by reference in its entirety.

TECHNICAL FIELD

The present invention relates to a method, a system and a computer readable medium for reading and programming flash memory cells.

BACKGROUND

Nonvolatile memories such as flash memories can be widely used as storage media in various systems. Some nonvolatile memories have cells capable of storing one bit each, while other enables storing two or more bits in each memory cell. Such memory cells are also referred to as multi-level cells (MLC) memories.

In a four-level flash memory, every cell may store two bits. In a program or read operation a whole page may be usually processed. A page may be constructed from a set of cells, and may include a single bit from each cell. Therefore, in a four-level memory there can be two pages defined—a Least Significant Bit (LSB) page referring to all LSB bits of the same string (or set of cells), and a Most Significant Bit (MSB) page.

In an eight-level MLC configuration, each memory cell may store three bits, which are referred to as a MSB, a Central Significant Bit (CSB) and a LSB. In a common reading scheme, the MSB can be read using a single threshold, the CSB can be read using a set of two thresholds, and the LSB can be read using a different set that may include four thresholds.

The flash memory page may be programmed in a gradual manner—programming the page using a single MSB threshold, programming the page using three CSB program thresholds, and programming the LSB page using seven program thresholds. The flash memory page can be programmed (at the beginning of the life cycle of the flash memory) so that the threshold voltages of the different flash memory cells may be within non-overlapping lobes. Over time the lobes may be shifted and deformed, thus, causing read errors.

SUMMARY

In one embodiment, the invention provides a method for reading flash memory cells. The method includes performing a first read operation while supplying a first bias voltage to multiple flash memory cells, to provide first read results, performing a second read operation while supplying a second bias voltage to the multiple flash memory cells, to provide second read results, wherein the first bias voltage is higher than the second bias voltage, and providing a read outcome that is responsive to the first read results and to the second read results.

In another embodiment, the invention provides a method for reading flash memory cells that includes detecting, out of multiple non-volatile memory cells, a group of non-volatile memory cells programmed to have an initial threshold voltage belonging to a lowest positive lobe of a threshold voltage distribution and a current threshold voltage that is negative. The detecting step includes performing a pair of read operations that differ from each other by a level of bias voltage provided to the multiple non-volatile memory cells, and associating lowest positive lobe logic value with each of the group of non-volatile memory cells.

In another embodiment, the invention provides a system for reading flash memory cells. The system includes multiple flash memory cells, a bias voltage unit, a read unit, and a controller. The read unit is configured to perform a first read operation while the bias voltage unit supplies a first bias voltage to the multiple flash memory cells to provide first read results. The read unit is further configured to perform a second read operation while the bias voltage unit supplies a second bias voltage to the multiple flash memory cells to provide second read results, wherein the first bias voltage is higher then the second bias voltage. The read unit is further configured to provide to the controller a read outcome that is responsive to the first read results and to the second read results.

In another embodiment, the invention provides a system for reading flash memory cells, the system includes a bias voltage unit, and a read unit that is configured to detect, out of multiple non-volatile memory cells, a group of non-volatile memory cells programmed to have an initial threshold voltage belonging to a lowest positive lobe of a threshold voltage distribution and a current threshold voltage that is negative. The read unit configured to perform, so as to detect the group of non-volatile memory cells, a pair of read operations that differ from each other by a level of bias voltage provided to the multiple non-volatile memory cells by the bias voltage unit, and the read unit is configured to associate a lowest positive lobe logic value with each of the group of non-volatile memory cells.

In another embodiment, the invention provides a method for programming flash memory cells. The method may include performing a first programming operation while supplying a first bias voltage to multiple flash memory cells, and performing a second programming operation while supplying a second bias voltage to multiple flash memory cells. The method may further include performing the first programming operation while programming information mapped to a highest least significant bit positive lobe, and performing the second programming operation while programming information mapped to at least one other least significant bit positive lobe.

BRIEF DESCRIPTION OF THE DRAWINGS

Certain embodiments of the present invention are illustrated in the following drawings.

DETAILED DESCRIPTION

Figure 1A:
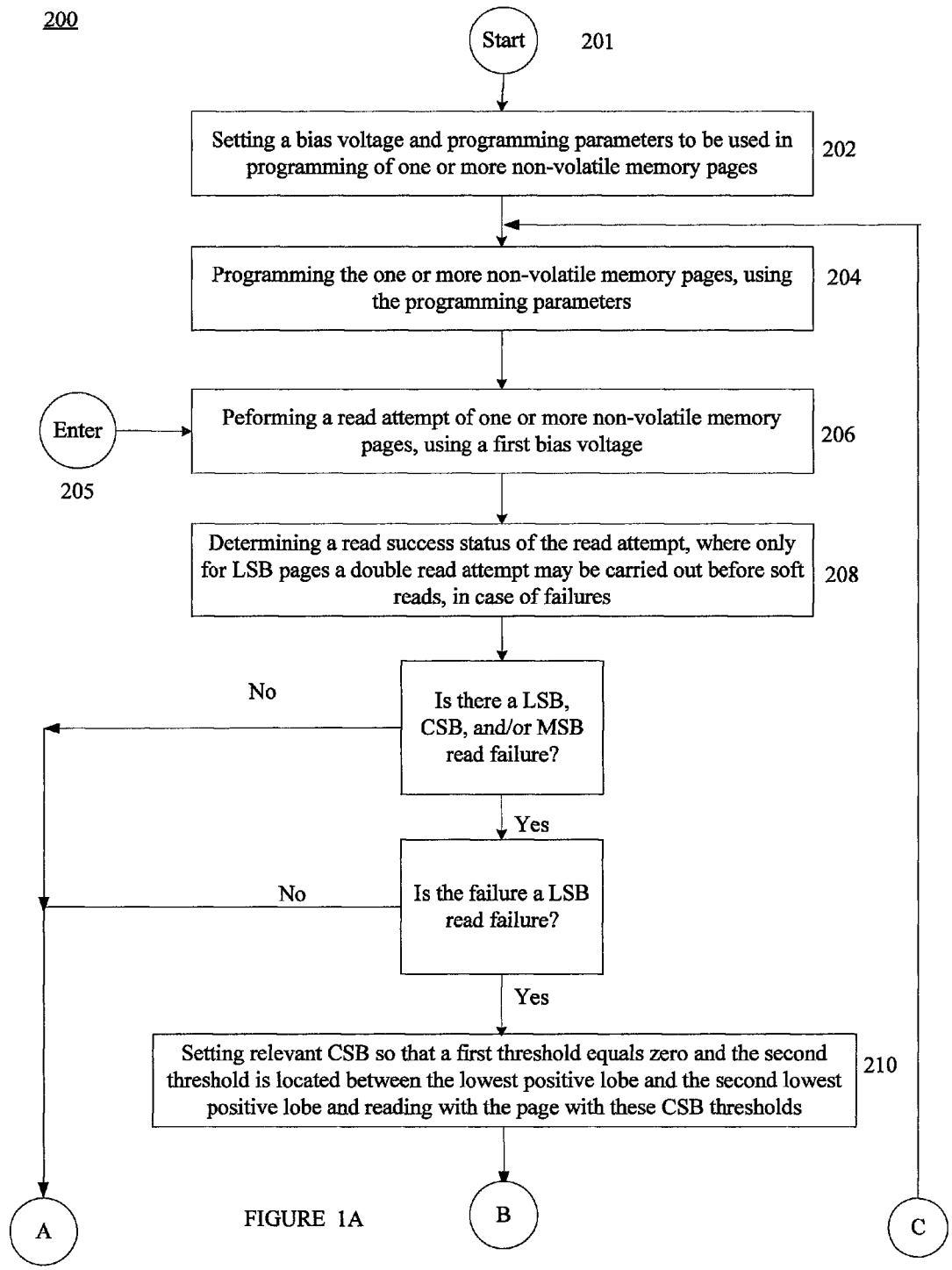
FIGS. 1A-1B illustrates a method according to an embodiment of the invention.

An embodiment of the invention may provide a method that may include performing a first read operation while supplying a first bias voltage (bias voltage may also be known as pass voltage) to multiple flash memory cells to provide first read results, performing a second read operation while supplying a second bias voltage to the multiple flash memory cells to provide second read results. The first bias voltage may be higher than the second bias voltage. The method may also provide a read outcome that may be responsive to the first read results and to the second read results.

Another embodiment of the invention may provide a computer readable medium. The computer readable medium can be a non-transient computer readable medium and may store instructions for performing a first read operation while supplying a first bias voltage to multiple flash memory cells to provide first read results, performing a second read operation while supplying a second bias voltage to multiple flash memory cells to provide second read results. The first bias voltage may be higher than the second bias voltage. The computer readable medium can also store instructions for providing a read outcome that may be responsive to the first read results and to the second read results.

According to a further embodiment of the invention, a computer readable medium may be provided. The computer readable medium can be a non-transient computer readable medium and may store instructions for detecting a group of non-volatile memory cells out of multiple non-volatile memory cells, where the group of non-volatile memory cells may be programmed to have an initial threshold voltage that may belong to a lowest positive lobe of a threshold voltage distribution but may have a current threshold voltage that may be negative. The detecting may include performing a pair of read operations that may differ from each other by a level of bias voltage provided to the multiple non-volatile memory cells and associating a lowest positive lobe logic value with each of the group of non-volatile memory cells.

In another embodiment, the invention may provide a method that may include detecting a group of non-volatile memory cells out of multiple non-volatile memory cells, where the group of non-volatile memory cells may be programmed to have an initial threshold voltage that may belong to a lowest positive lobe of a threshold voltage distribution but have a current threshold voltage that is negative. The detecting may include performing a pair of read operations that may differ from each other by a level of bias voltage provided to the multiple non-volatile memory cells, and associating a lowest positive lobe logic value with each of the group of non-volatile memory cells. Positive threshold voltages may be configurable. However, using a lower Vbias for a certain threshold voltage may be equivalent to reading with a negative threshold voltage and a higher Vbias.

According to an embodiment of the invention, a system is provided that may include multiple flash memory cells, a bias voltage unit, a read unit, and a controller. In an embodiment, the read unit may be configured to perform a first read operation while the bias voltage unit may supply a first bias voltage to the multiple flash memory cells to provide first read results to perform a second read operation while the bias voltage unit may supply a second bias voltage to the multiple flash memory cells to provide second read results. The first bias voltage may be higher than the second bias voltage, and to provide a read outcome that may be responsive to the first read results and to the second read results.

According to another embodiment of the invention, a system may be provided that may include a bias voltage unit, and a read unit that may be configured to detect a group of non-volatile memory cells out of multiple non-volatile memory cells that may be programmed to have an initial threshold voltage that may belong to a lowest positive lobe of a threshold voltage distribution but may have a current threshold voltage that may be negative. In an embodiment, the read unit may be configured to detect the group of non-volatile memory cells by performing a pair of read operations that may differ from each other by a level of bias voltage provided to the multiple non-volatile memory cells by the bias voltage unit, and wherein the read unit may be configured to associate the lowest positive lobe logic value with each of the non-volatile memory cells in the group of non-volatile memory cells.

According to an embodiment of the invention a method may include performing a first programming operation while supplying a first bias voltage to multiple flash memory cells; and performing a second programming operation while supplying a second bias voltage to multiple flash memory cells.

According to an embodiment of the invention a computer readable medium may be provided. The computer readable medium can be a non transient computer readable medium and may store instructions for: performing a first programming operation while supplying a first bias voltage to multiple flash memory cells; and performing a second programming operation while supplying a second bias voltage to multiple flash memory cells.

According to an embodiment of the invention a system may include multiple flash memory cells, and a write unit for performing a first programming operation while supplying a first bias voltage to multiple flash memory cells, and for performing a second programming operation while supplying a second bias voltage to multiple flash memory cells.

At least some of the following description may refer to 3-bit per cell nonvolatile memory modules. It is noted that the methods and devices illustrated below may be applied mutatis mutandis to any multiple bit per cell memory modules.

It is noted that according to various embodiments of the invention, various methods of manipulating bias voltage during reading from a nonvolatile memory may be implemented. Such methods may include attempting to read from a page of a nonvolatile memory using a first bias voltage, selectively modifying the bias voltage to a second bias voltage in response to success estimation of the attempting, and reading the page using the second bias voltage. The second bias voltage may be lower than the first bias voltage, but this is not necessarily so. The second bias voltage may be higher than the first bias voltage, but this is not necessarily so.

It is noted that manipulating the bias voltage may enable, inter alia, higher robustness for retention testing (and/or improved retention when compared to implementing a substantially fixed bias voltage). Change of bias voltage may result in changes to the relative threshold voltage for a read operation. By reducing the bias voltage, the threshold value for bit value change may be lowered.

It is noted that this change effectively gives the capability of increasing the programming and read window. According to an embodiment of the invention, this may be implemented, inter alia, for shift compensation due to de-trapping during retention testing. Sufficiently reducing the bias voltage here may allow read with minimal number of errors at the lowest threshold that is associated with the first non-erase lobe.

According to an embodiment of the invention, manipulating the bias voltage may enable, inter alia, common baseline for reading programmed devices under test (DUTs)—as the default values for the bias voltage of different DUTs may be different. Using the same value for the bias voltage creates a common baseline for reading with the same parameters. Using identical bias voltage values for all DUTs during programming, and then during read may significantly reduce the calibration errors.

According to an embodiment of the invention, a system may include a reading unit adapted to read information from pages of a nonvolatile memory at different bias voltages in different times. The system may further include a processor configured to select bias voltage in response to success estimation of the read attempts by the reading unit. A system may implement various embodiments of method 200 and/or other herein disclosed methods. It is noted that the nonvolatile memory may be part of the system, but this is not necessarily so.

As aforementioned, a change of bias voltage may result in changes to the relative threshold voltage for a read operation, and reducing the bias voltage may result in lowering the threshold value for bit value change, thus effectively increasing the program and read voltage window. Effective increase in window size may result from compensation for retention de-trapping by reading with a low Bias voltage for the first threshold.

Figure 1B:
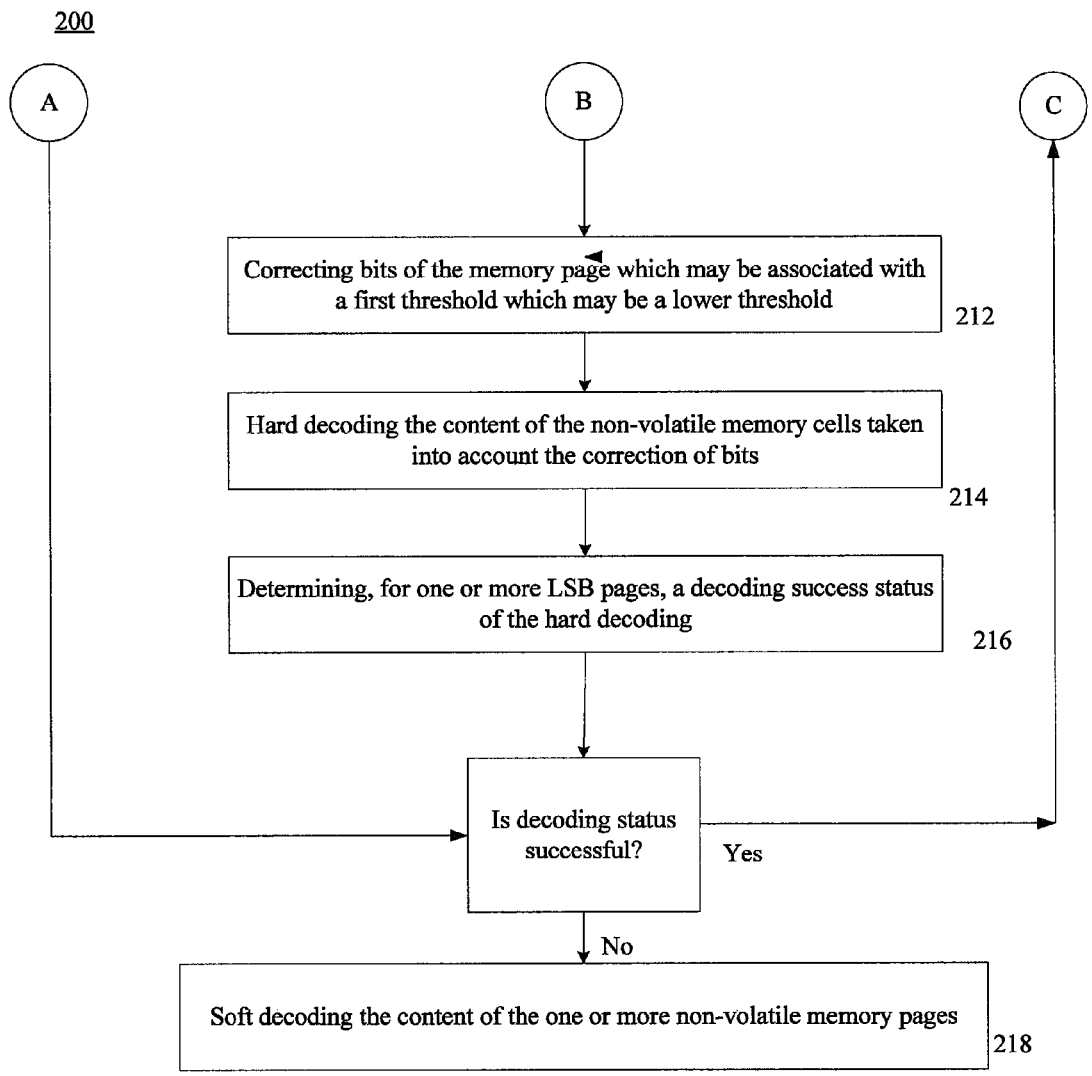

FIGS. 1A and 1B illustrate method 200 for reading flash memory cells according to an embodiment of the invention. Method 200 may begin, step 201, by setting a bias voltage and programming parameters, step 202. Method 200 may also be entered, step 205, by performing a read attempte of one or more non-volatile memory pages using a first bias voltage, step 206.

Method 200 may set, step 202, a bias voltage and programming parameters to be used in programming of one or more non-volatile memory pages.

The one or more non-volatile memory pages may be programmed, step 202, using the programming parameters. The programming may include, for example, programming one or more non-volatile memory page as a MSB page, a CSB page and a LSB page.

An attempt to read one or more non-volatile memory pages may be performed, step 206, using a first bias voltage. The first bias voltage may be the bias voltage that was supplied to the read non-volatile memory page during programming, or any other bias voltage configured by the memory controller. The reading may include at least one of the following—reading a MSB page (using a MSB threshold), reading a CSB page (using a pair of CSB thresholds) or reading a LSB page (using four LSB thresholds). It is noted that if the non-volatile memory pages include cells that may store more than 3-bit per cells then more than three read attempts may be executed.

A read success status of the read attempt may be determined, step 208, which may usually be an indication provided by the error correction code (ECC) that follows this read. In case of an LSB page type read failure, step 208 may be followed by step 210. In case of a MSB or a CSB page type read failure, then step 208 may be followed by step 218. Process 200 may include multiple read attempts at different times, and a program step may not always be followed by a read step.

Step 210 may include setting relevant CSB(s) thresholds so that a first threshold equals zero and the second threshold is located between the lowest positive lobe and the second lowest positive lobe.

Step 210 also may include providing a second bias voltage that may have a low voltage (e.g., a predetermined low value, a value lower than before, and so forth) and reading the one or more pages of non-volatile memory cells using CSB thresholds. Accordingly, a CSB page-type read can be performed for the logical LSB page type of interest. The second bias voltage may differ from the first bias voltage.

The two read results (of LSB and CSB pages) can be combined. Bits of the memory page which may be associated with a first threshold may be corrected, step 212, which may conveniently be a lowest threshold associated with substantially zero threshold voltage. The correcting can be executed according to both read results.

The bits obtained from the combined two read operations (steps 206 and 210) may undergo hard decoding using a hard decode algorithm, step 214, taken into account the correction of bits of step 212.

For one or more LSB pages, a decoding success status of the hard decoding is determined, step 216. This is indicative of success of hard decoding of the LSB pages. If the hard decoding is successful, step 216 may be followed by step 206, else step 216 may be followed by step 218 of soft decoding the content of the one or more non-volatile memory pages using a soft decode algorithm. Step 218 may include performing more than a pair of reading operations to provide multiple read outcomes and then performing a soft decoding on the multiple read outcomes. If the soft decoding is successful step 218 may be followed by continuing to read the next page, step 206. A hard decoding status may be obtained for all page types (LSB, CSB, and MSB).

According to an embodiment of the invention, modifying the bias voltage as disclosed in relation to the herein disclosed systems and methods may enable, inter alia, increased resolution sampling with lower effective threshold voltages, which may provide reliability metrics (e.g., log-likelihood ratio (LLR) calculation), for soft decoding based on reads with low bias voltage.

According to an embodiment of the invention, modifying the bias voltage as disclosed in relation to the herein disclosed systems and methods may enable, inter alia, hard decoding after two reads (nominal bias voltage, an additional one with CSB and low Bias voltage for lowest threshold only—correct only changes from '1' to '0'). Also two reads may be possible. This is done to achieve a low uncoded bit error rate (UBER) at lowest threshold.

Figure 2:
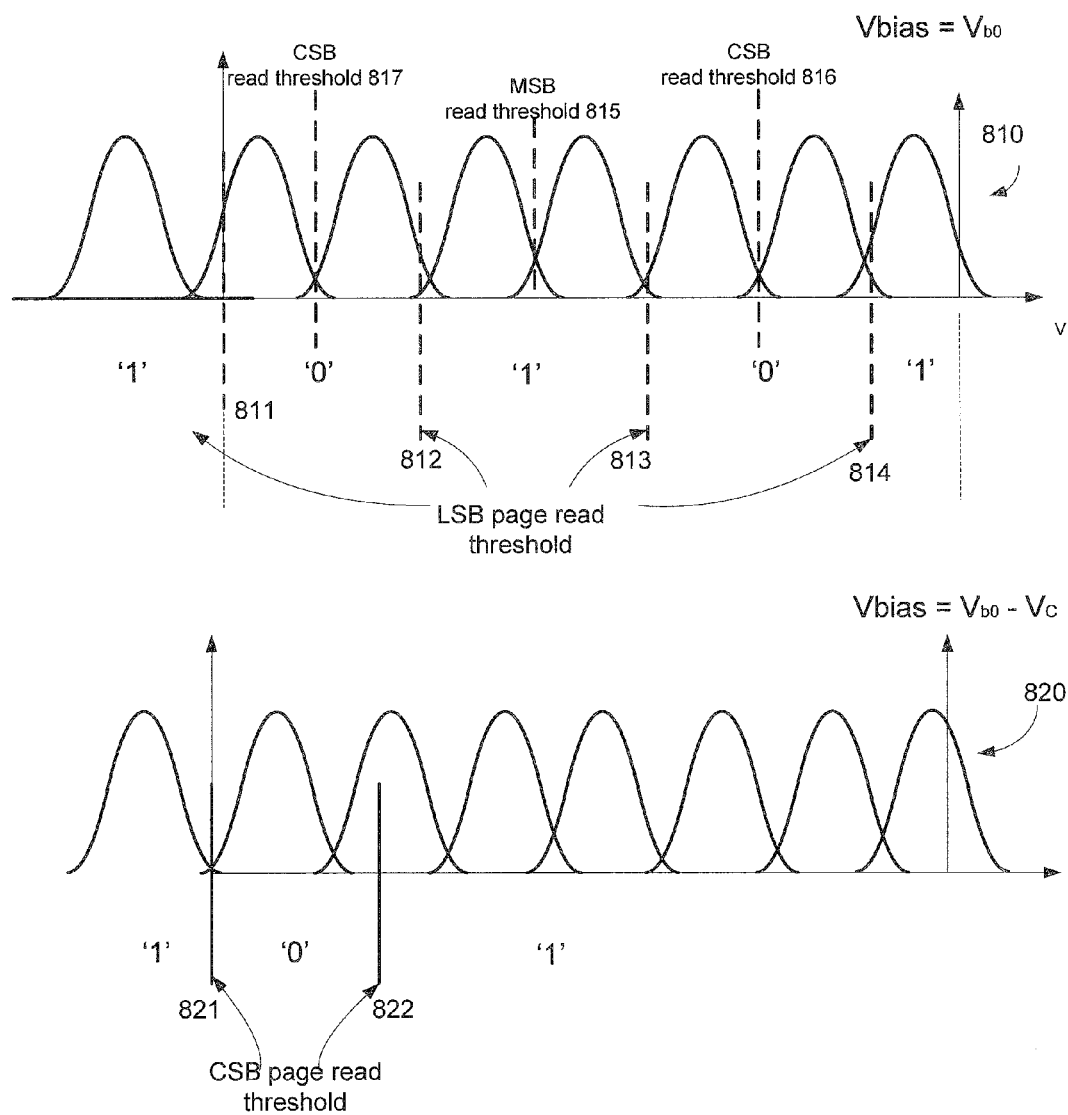
FIG. 2 illustrates threshold voltage distributions according to an embodiment of the invention.

FIG. 2 illustrates threshold voltage distributions obtained when providing bias voltages of different values.

The upper threshold voltage distribution 810 may be achieved when the programming is executed while providing an initial bias voltage Vbo.

The lower voltage distribution 820 may be achieved when the programming is executed while providing a lower bias voltage (Vbo−Vc).

The upper threshold distribution voltage may be read while setting LSB thresholds 811-814. Threshold 811 may be set at zero (y-axis). Threshold 812 may be set to the left of the third lowest positive lobe. Threshold 813 may be set to the left of the fifth lowest positive lobe, and threshold 814 may be set to the left of the seventh lowest positive lobe. In this example, reading the LSB page with bias voltage Vbo, can end-up with many errors which originate mostly from the first lowest threshold. The upper threshold distribution may also be read using MSB threshold 815, CSB threshold 816 and CSB threshold 817.

FIG. 2 illustrates that a lowest positive lobe shifted to the left and a portion of that lobe may have negative values (positioned to the left of the y-axis) and may be read as "1"

(erase value), which may be interpreted as read errors. These read errors may be corrected by applying a second read operation of the corresponding CSB page, with a lower bias voltage. The lower threshold voltage may be read while setting CSB thresholds 821 and 822, threshold 821 may be set at zero (y-axis) and threshold 812 may be set to the right of the first lowest positive lobe.

The lower bias voltage (Vbo−Vc) may shift the threshold voltage distribution to the left and may cause the previously negative portion of the lowest positive lobe to become effectively positive.

By applying a simple logical AND operation between the two read results may provide a unified LSB read result with much fewer errors, than a single read with a nominal bias voltage.

According to an embodiment of the invention, modifying the bias voltage as disclosed in relation to the herein disclosed systems and methods may enable, inter alia, delaying the start of soft decoding by using a lower bias voltage for page reads than the programming bias voltage.

According to an embodiment of the invention, modifying the bias voltage as disclosed in relation to the herein disclosed systems and methods may enable, inter alia, utilization of the nominal bias voltage for MSB pages and CSB pages. In a three bits per cell flash memory, the read thresholds for MSB pages and CSB pages may be computed during training with the nominal bias voltage. The lower bias voltage may be used for LSB pages. is that typically The error rate may be minimal when using the same bias voltage for program and read so different thresholds for different page types may be introduced. In a three bits per cell memory, the MSB and CSB associated thresholds, usually, may not have any overlap with the threshold voltage window ends (Vth=0 or Vth=Vmax). However, the LSB page may suffer, for example, from errors on the first lowest read threshold. Therefore in LSB pages, using a read bias voltage lower than the programming bias voltage may allow operation in low average read error rates at the start of life, and delay the beginning of double reads or soft reads. Therefore, the training mechanism which computes the read thresholds may be configured with a suitable read bias voltage according to the page type.

According to an embodiment of the invention, the nominal bias voltage for LSB page reads may be set with accordance to the retention estimation done during a training process, which estimates the distribution degradation.

According to an embodiment of the invention, modifying the bias voltage as disclosed in relation to the herein disclosed systems and methods may enable, inter alia, increased reliability which may allow more program/erase (P/E) cycles compared to a conventional Flash device, and greater robustness to retention testing.

According to an embodiment of the invention, modifying the bias voltage as disclosed in relation to the herein disclosed systems and methods may enable, inter alia, programming with high bias voltage, and reading with low bias voltage after a retention test.

According to an embodiment of the invention, modifying the bias voltage as disclosed in relation to the herein disclosed systems and methods may enable, inter alia, increasing the program/read window size by programming with high bias voltage for the highest lobe, and then programming with a lower bias voltage the other lobes (for the LSB pages only). This modification may increase the effective window size. According to an embodiment of the invention, single step programming may be performed up to a certain cycle count, and the two step programming of LSB pages may be performed for higher cycle counts where the retention testing effect may be more severe.

Figure 3:
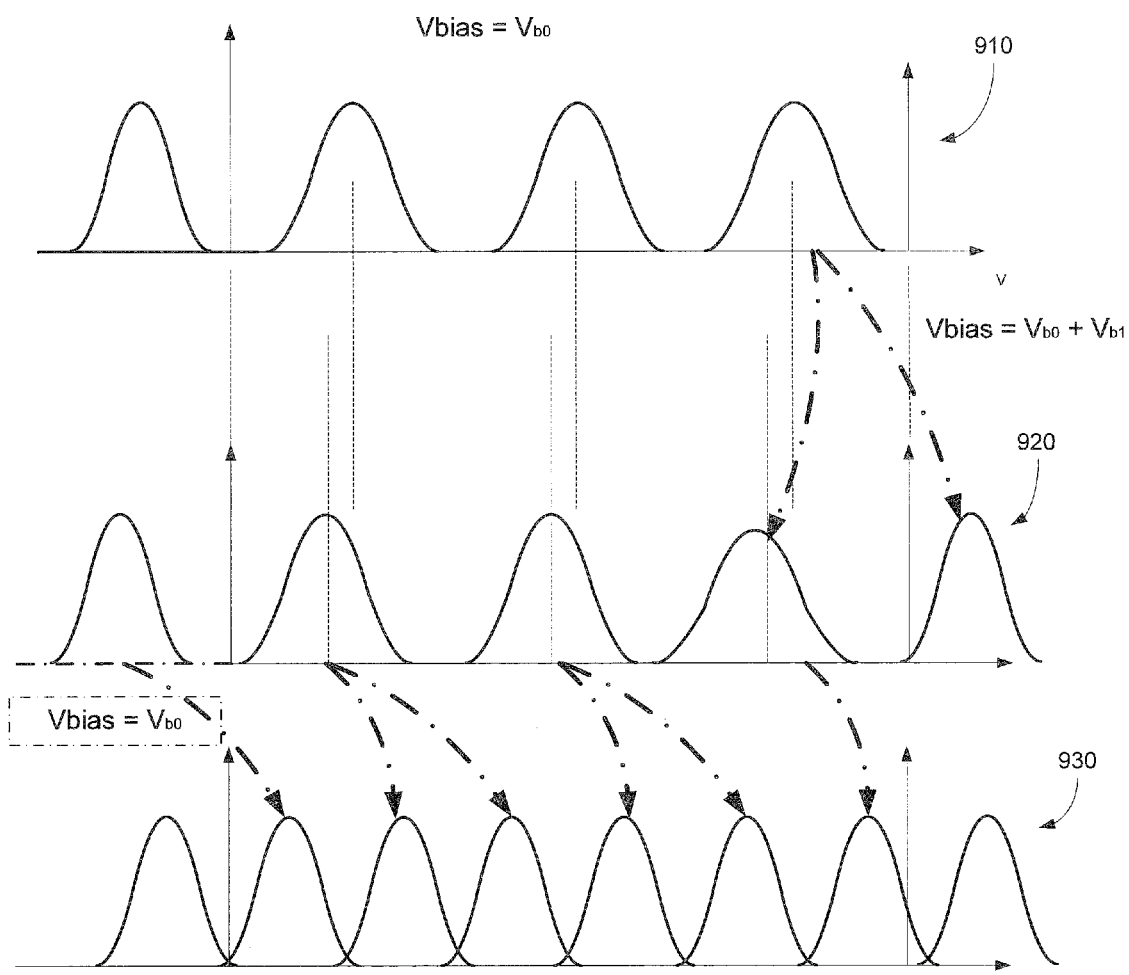
FIG. 3 illustrates a programming operation according to an embodiment of the invention.

FIG. 3 illustrates a two step programming of a LSB page programming operation for a 3 bits per cell memory according to an embodiment of the invention.

As may be noticed from FIG. 3, a CSB programmed page threshold voltage distribution 910 may be given with a first bias voltage $V_{b0}$ as the initial page condition.

The intermediate threshold voltage distribution 920 may be obtained when supplying a second bias voltage of ($V_{b0}$+$V_{b1}$). The lowest threshold voltage distribution 930 may be obtained while providing the first bias voltage of $V_{b0}$.

During a first programming step (referring to the intermediate threshold voltage distribution 920) the cells associated with the highest LSB lobe may be initially programmed with the second bias voltage ($V_{b0}$+$Y_{b1}$). The programming voltage for the highest lobe in the example can be the maximum voltage supported (although it may also be smaller). This may result in an addition of a new lobe. The programming step may be followed by a step of setting the bias voltage to $V_{b0}$ and programming the other LSB page cells. This may result in the lowest threshold voltage distribution 930.

Figure 9:
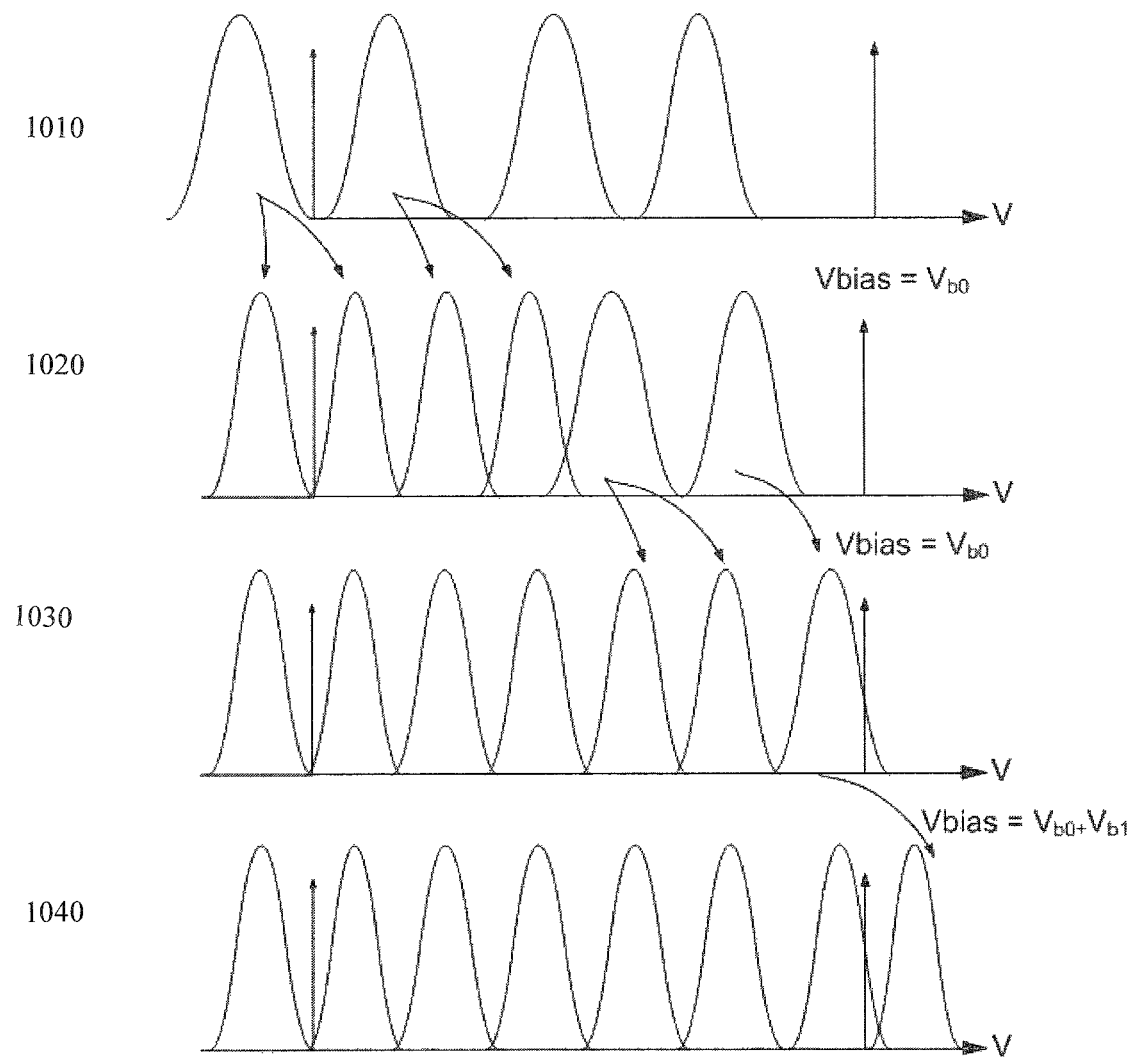
FIG. 9 illustrates a programming operation according to an embodiment of the invention.

FIG. 9 illustrates another embodiment of the invention that may include a single command for programming the highest lobe with a higher bias voltage. This embodiment can be implemented within the programming algorithm of the flash device, which may sequentially program all lobes. LSB page programming may be performed, with a distribution 1010 and starting at a bias voltage $V_{b0}$ as the initial page condition before starting to program the LSB page. The six lower positive lobes, shown in distributions 1020 and 1030, may be programmed sequentially. The last programming step may include programming of a seventh, and highest, positive lobe using a higher bias voltage $V_{b0}$+$V_{b1}$, as shown in distribution 1040.

An embodiment of the invention includes double reads for the highest threshold. With reference to FIG. 3, reading the LSB page with the first bias voltage $V_{b0}$ right after programming might result in a large error rate at the highest threshold. Therefore a first read with a first $V_{b0}$ may be required, and a second CSB read with second bias voltage $V_{b0}$+$V_{b1}$ can follow, jointly correcting the set of errors from the highest threshold and then applying the ECC hard decoding.

According to another embodiment of the invention, read errors may be eliminated, when changing the bias voltage, by identifying a large step threshold voltage change. Changing the bias voltage from its programming value may result in high read error rates. However, it may be desirable, for example, to decrease the read bias voltage in order to read cells associated with the first non-erase lobe. For detecting read disturbs due to lower bias voltage it may be possible to check the read threshold voltage during multiple reads and ignore reads for which the threshold voltage step may be above some predefined threshold.

Figure 4:
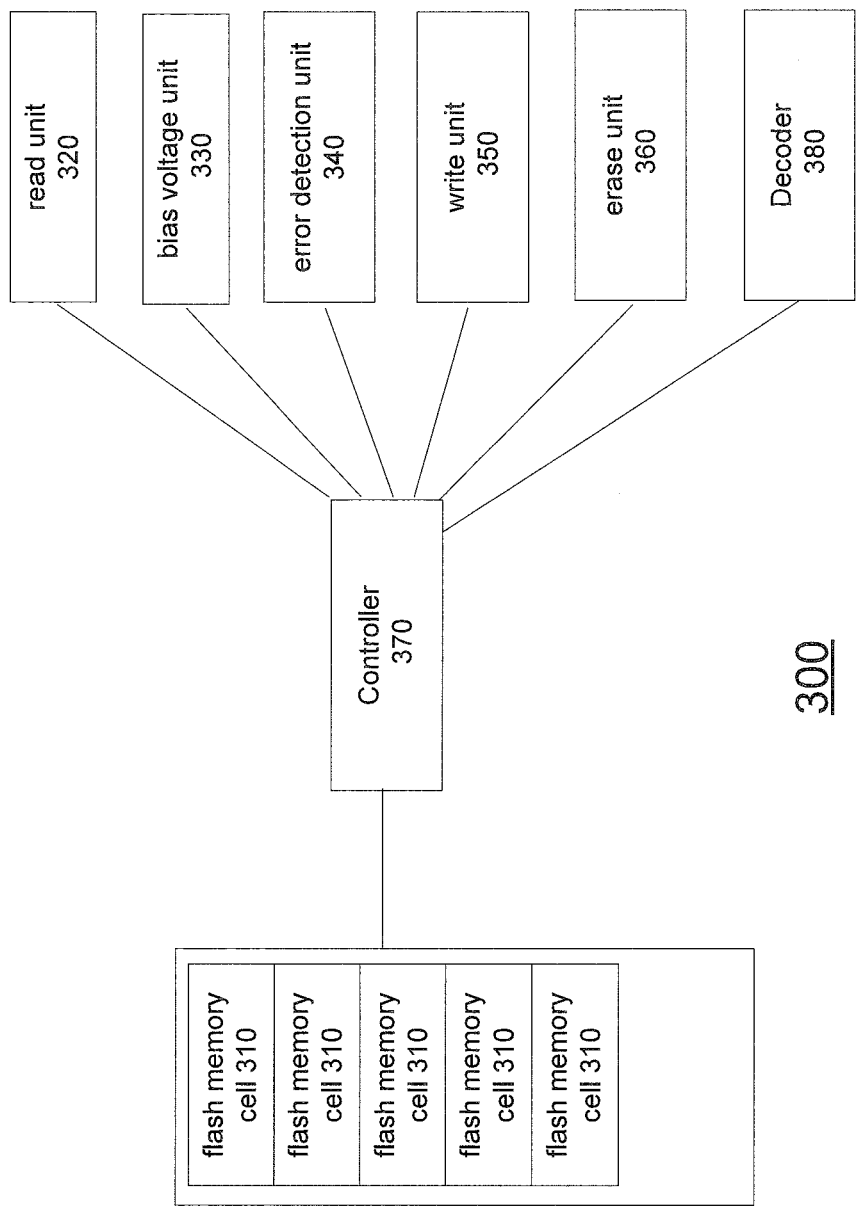
FIG. 4 illustrates a system according to an embodiment of the invention.

FIG. 4 illustrates system 300 according to an embodiment of the invention.

System 300 may include one or more flash memory cells 310, read unit 320, bias voltage unit 330, error detection unit 340, write unit 350, erase unit 360, controller 370 and decoder 380. These units (310, 320, 330, 340, 350, 360, 370 and 380) may be connected to each other and, additionally or alternatively, may be included in each other. For example, memory controller 370 may include other components such as read unit 320, bias voltage unit 330, error detection unit 340, write unit 350, erase unit 360 and/or decoder 380

Multiple flash memory cells 310 may be a part of a flash memory page, may form one or more flash memory pages, and the like.

Controller 370 may control the operation of the multiple flash memory cells 310, read unit 320, bias voltage unit 330, error detection unit 340, write unit 350 and erase unit 360.

Controller 350 may be a memory controller or a part of a memory controller but this is not necessarily so.

System 300 may execute any step of methods 200, 400 and 500 or a combination thereof.

System 300 may operate according to the following:

(A) Controller 370 may set a bias voltage and programming parameters that may be used in programming multiple flash memory cells. It is noted that the bias voltage and programming parameters may be fed to controller 370.

(B) Write unit 350 may program multiple flash memory cells using the programming parameters. The write unit can, for example, program one or more non-volatile memory page as a MSB page, a CSB page and a LSB page.

(C) Read unit 320 may perform a read attempt of multiple flash memory cells (for example, reading one or more flash memory pages). Bias voltage unit 330 may provide a first bias voltage to the multiple flash memory cells. The first bias voltage may be the bias voltage that was supplied to the multiple flash memory cells during programming. The read unit may include structure capable of performing at least one of the following operations—reading a MSB page (using a MSB threshold), reading a CSB page (using a pair of CSB thresholds), or reading a LSB page (using four LSB thresholds).

(D) Error detection unit 340 may determine a read success status of the read attempt, which is indicative of success of reading of one or more LSB pages during the read attempt. The read success status may be indicative or read errors.

(E) Controller 370 may determine, based on the read success status, whether to continue to perform a single read operation per read attempt or to perform a pair of read operations (that may differ from each other by the bias voltage provided during each read operation) per read attempt.

(F) If the read error is above a predefined threshold or if the read success status is not good enough, then system 300 may start by performing a pair of read operations per each read attempt. This may occur if the page type with read failure had a low threshold at Vth=0.

(G) Read unit 320 may set relevant CSB thresholds so that a first threshold equals zero and the second threshold is located between the lowest positive lobe and the second lowest positive lobe (H) Read unit 320 may perform, during each read attempt, a first read operation while bias voltage unit 330 may provide a first bias voltage to multiple flash memory cells 310. Read unit 320 may perform a second read operation while bias voltage unit 330 may provide a second bias voltage that may have a low voltage (e.g. a predetermined low value, a value lower than before, and so forth). The second bias voltage may differ from the first bias voltage.

(I) The first read operation may provide first read results and the second read operation may provide second read results. Read unit 320 may provide a read outcome based on the first and second read results. Read unit 320 may correct bits of flash memory cell that can be associated (during the first read operation) with a zero value and can be associated (during the second read operation) with a threshold voltage that may belong to a lowest positive lobe.

(J) Decoder 380 may perform a hard decoding of the read outcome and may take into account the correction of bits.

(H) Error detection unit 340 may determine (for example for one or more LSB pages) a decoding success status of the hard decoding. If the hard decoding is successful, system 300 may continue performing a pair or read operations per read attempt. Else, system 300 may perform more than a pair of read operations per read attempt and have decoder 380 perform a soft decoding of the read outcomes.

Figure 5:
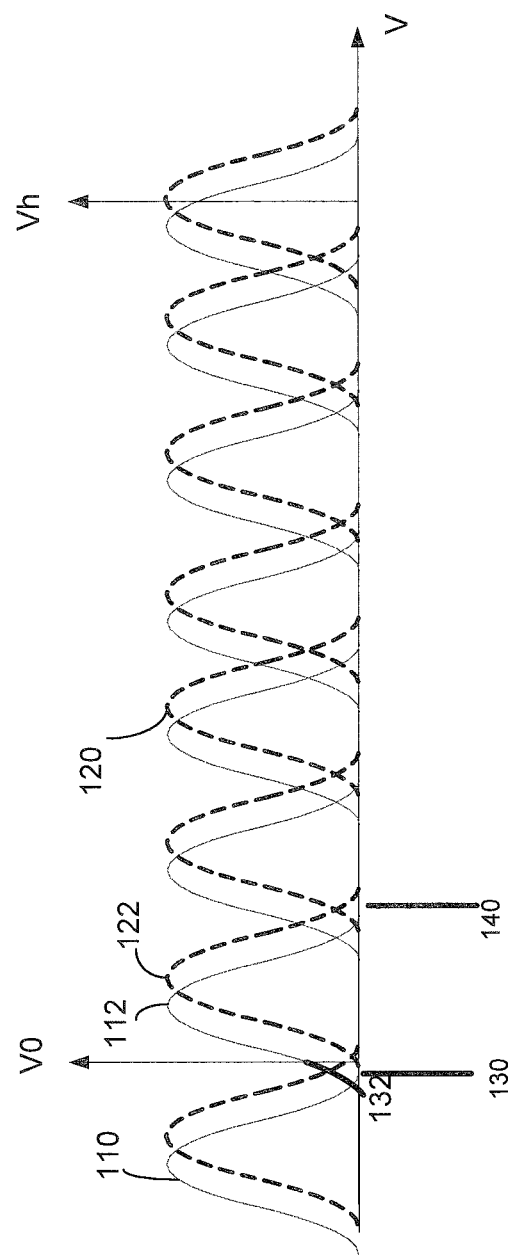
FIG. 5 illustrates two threshold voltage distributions of multiple flash memory cells according to an embodiment of the invention.

FIG. 5 illustrates two threshold voltage distributions of multiple flash memory cells, according to an embodiment of the invention.

Curve 110 may represent a first threshold voltage distribution of multiple flash memory cells that may be read while receiving a first bias voltage.

Curve 120 may represent a second threshold voltage distribution of multiple flash memory cells that may be read while receiving a second bias voltage. The second bias voltage may be lower than the first bias voltage and curve 120 may be shifted to the right in relation to curve 110.

A lowest positive lobe 122 of curve 120 may be shifted to the right in relation to a lowest positive lobe 112 of curve 110.

Referring to lowest positive lobe 112—it may be obtained by initially programming flash memory cells to have a positive value. Various phenomena, for example charge de-trapping, may shift lowest positive lobe 112, widen, or otherwise deform, lowest positive lobe 112 so that a portion (132) of that lobe may correspond to negative threshold voltages.

Accordingly, a set of flash memory cells that may have initially been programmed to a positive threshold voltage (that initially belonged to lowest positive lobe 112 and initially associated with value '1') currently may have negative threshold voltages—when applying the first bias voltage.

When applying the first bias voltage the set of flash memory cells may be associated with a '0' logic value.

When applying the second bias voltage the threshold voltages of these flash memory cells may be above zero and may be viewed as a part of lowest positive lobe 122. These flash memory cells may be associated with a lowest positive lobe value of "1".

FIG. 5 also illustrates a first threshold 130 and a second threshold 140 that may be set during a read operation such as a second read operation that may be executed when the second threshold voltage is provided.

Figure 6:
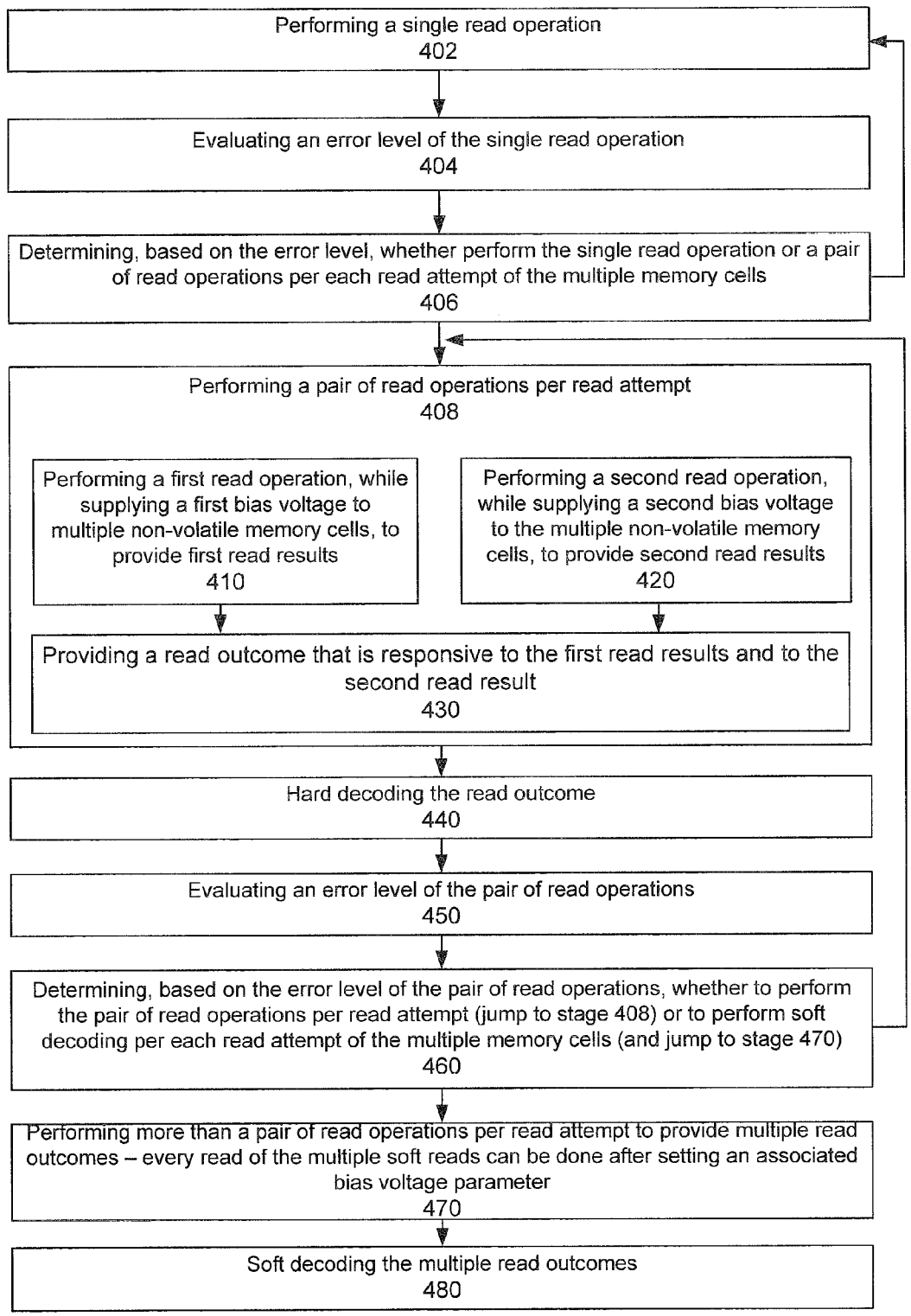
FIG. 6 illustrates a method according to an embodiment of the invention.

FIG. 6 illustrates method 400 for reading flash memory cells according to an embodiment of the invention.

A single read operation may be performed, step 402. The single read operation may be executed due to a reception of a request to read the multiple flash memory cells. The single read operation may be regarded as a read attempt.

An error level of the single read operation is evaluated, step 404. This can be done for example by counting the number of errors detected by the decoder.

A determination may be made, step 406, based on the error level, whether to perform the single read operation or a pair of read operations per each read attempt of the multiple memory cells. If the error level is low enough (for example—below a predefined error threshold) then step 406 may be followed by step 402 so that the following read attempts will include a single read operation. Else step 406 may be followed by performing a pair of read operations per read attempt of desirable page types, step 408. That is, the double read attempt does not need to be done for every page type. The double read attempt may be done, for example, on LSB pages only.

The first of the pair of read operations per read attempt, step 410, may include performing a first read operation, while supplying a first bias voltage to multiple non-volatile memory cells, to provide first read results.

Step 410 may include comparing a content of the multiple non-volatile memory cells to a first threshold that is set to zero and a second threshold that has a value that is between a lowest positive lobe and a second lower positive lobe of a threshold voltage distribution of the non-volatile memory cells.

The second of the pair of read operations per read attempt, step 420, may include performing a second read operation, while supplying a second bias voltage to the multiple non-volatile memory cells, to provide second read results. The first bias voltage may be higher than the second bias voltage. Step 420 may include comparing a content of the multiple non-volatile memory cells to a first threshold that may be set to zero and a second threshold that may have a value that may be between a lowest positive lobe and a second lower positive lobe of a threshold voltage distribution of the non-volatile memory cells.

A read outcome that is responsive to the first read results and to the second read results may be provided following steps 410 and 420 at step 430.

A set of non-volatile memory cells, may be located, step 430, that according to the first read results store a zero logic value, and according to the second read results store a lowest positive lobe value associated with a lowest positive lobe of a threshold voltage distribution of the non-volatile memory cells. A read outcome that may associate a lowest positive lobe value with the set of memory non-volatile cells may also be provided by step 430.

The read outcome may undergo hard decoding, step 440.

An error level of the pair of read operations may be evaluated, step 450.

Based on the error level of the pair of read operations, a determination, step 460, may be made whether to perform the pair of read operations per read attempt (jump to step 408), or to perform soft decoding per each read attempt of the multiple memory cells (jump to step 470).

More than a pair of read operations per read attempt may be performed, step 470, to provide multiple read outcomes.

Step 470 may be followed by step 480 of soft decoding the multiple read outcomes.

Step 470 may include reading multiple flash memory cells while providing different values of bias voltage configuration during the multiple reads. Reading multiple flash memory cells may be done when the multiple reads are done with low threshold voltages, as to possibly minimize the read disturbs and possibly improve the LLR accuracy at the same time. That is, every soft page read may be preceded by a bias voltage level configuration.

Figure 7:
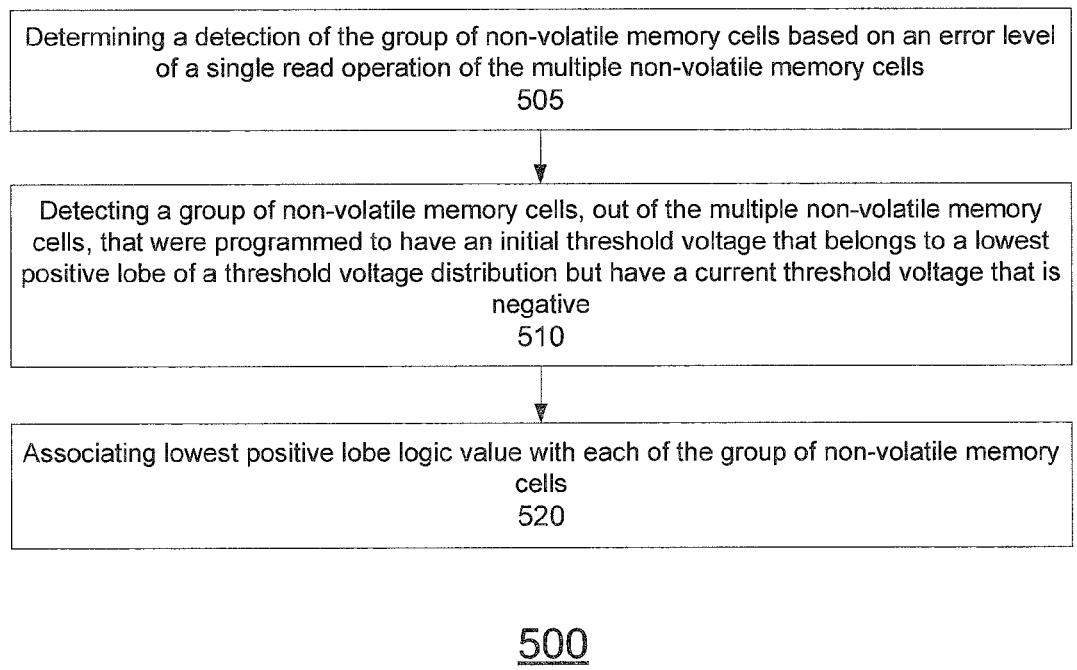
FIG. 7 illustrates a method according to an embodiment of the invention.

FIG. 7 illustrates method 500 for reading flash memory cells according to an embodiment of the invention.

A detection of the group of non-volatile memory cells based on an error level of a single read operation of the multiple non-volatile memory cells may be determined, step 505. Step 505 may include determining whether to detect the group based on an erase cycle count value, on expected error levels, and the like.

A group of non-volatile memory cells, out of the multiple non-volatile memory cells, that may be programmed to have an initial threshold voltage that may belong to a lowest positive lobe of a threshold voltage distribution but have a current threshold voltage that may be negative may be detected, step 510. The detecting may include performing a pair of read operations that may differ from each other by a level of bias voltage provided to the multiple non-volatile memory cells.

A lowest positive lobe logic value may be associated, step 520, with each of the group of non-volatile memory cells.

Figure 8:
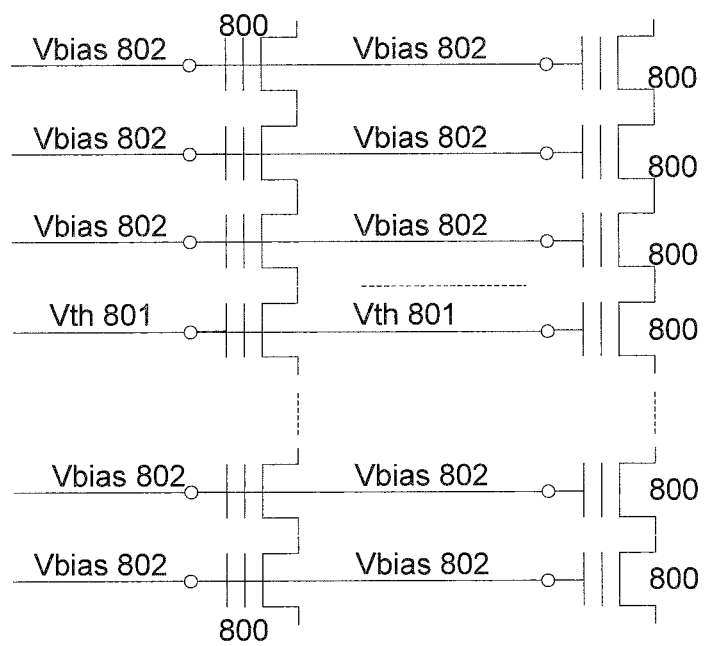
FIG. 8 illustrates multiple flash memory cells and signals according to an embodiment of the invention.

FIG. 8 illustrates multiple flash memory cells 800 and signals that may be supplied to the multiple flash memory cells according to an embodiment of the invention.

The flash memory cells 800 may be arranged in rows and columns Cells of a row that are being read or written receive at their gate a threshold voltage Vth 801 while cells of other rows receive at their gates a bias voltage Vbias 802.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Any data described as being stored at a specific location in memory may alternatively be stored elsewhere, in conjunction with an indication of the location in memory with which the data is associated. For example, instead of storing page-, or erase-, sector-specific information within a specific page or erase sector, the same may be stored within the flash memory device's internal microcontroller or within a microcontroller interfacing between the flash memory device and the host, and an indication may be stored of the specific page or erase sector associated with the cells.

It is appreciated that the teachings of the present invention can, for example, be implemented by suitably modifying, or interfacing externally with, flash controlling apparatus. The flash controlling apparatus controls a flash memory array and may comprise either a controller external to the flash array or a microcontroller on board the flash array or otherwise incorporated therewithin. Examples of flash memory arrays may include Samsung's K9XXGO8UXM series, Hynix's HY27UKO8BGFM Series, Micron's MT29F64G08TAAWP, or other arrays such as but not limited to NOR or phase change memory. Examples of controllers which are external to the flash array they control may include STMicroelectrocincs's ST7265x microcontroller family, STMicroelectrocincs's ST72681 microcontroller, and SMSC's USB97C242, Traspan Technologies' TS-4811, Chipsbank CBM2090/CBM1190. Examples of commercial IP software for Flash file systems are: Denali's Spectra™ NAND Flash File System, Aarsan's NAND Flash Controller IP Core and Arasan's NAND Flash File System. It is appreciated that the flash controller apparatus need not be NAND-type and may alternatively, for example, be NOR-type or phase change memory-type.

Flash controlling apparatus, whether external or internal to the controlled flash array, typically includes the following components: a Memory Management/File system, a NAND interface (or other flash memory array interface), a Host Interface (USB, SD or other), error correction circuitry (ECC) typically comprising an encoder and matching decoder, and a control system managing all of the above.

The present invention may for example interface with or modify, as per any of the embodiments described herein, one, some or all of the above components.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software.

Features of the present invention which are described in the context of separate embodiments may also be provided in combination in a single embodiment. Conversely, features of the invention, including method steps, which are described for brevity in the context of a single embodiment or in a certain order may be provided separately or in any suitable sub-combination or in a different order. The term "e.g." is not used herein in the sense of a specific example, and is not intended to be limiting.

Thus, while there have been shown, described, and pointed out fundamental novel features of the invention as applied to several embodiments, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. A system for reading flash memory cells, the system comprising:
    multiple flash memory cells that are arranged in multiple columns and in multiple rows;
    a bias voltage unit;
    a read unit; and
    a controller;
    wherein the read unit is configured to:
    perform a first read operation of flash memory cells of a certain row of the multiple rows while supplying a read threshold to the flash memory cells of the certain row and while the bias voltage unit supplies a first bias voltage to flash memory cells of other rows of the multiple rows, the other rows differ from the certain row to provide first read results of the flash memory cells of the certain row;
    perform a second read operation of flash memory cells of the certain row while supplying the read threshold to the flash memory cells of the certain row while the bias voltage unit supplies to flash memory cells of the other rows a second bias voltage to provide second read results of the flash memory cells of the certain row, wherein the first bias voltage is higher than the second bias voltage, and
provide to the controller a read outcome that is responsive to the first read results and to the second read results;
    wherein the read unit is configured to provide the second read results by comparing a content of the multiple non-volatile memory cells to a first threshold set to zero, and to a second threshold that has a value between a lowest positive lobe and a second lower positive lobe of a threshold voltage distribution of the non-volatile memory cells.

2. The system according to claim 1, wherein the controller is configured to determine whether a single read operation per read attempt or a pair of read operations per read attempt is to be performed by the read unit; and wherein the read unit is configured to perform the single read operation per read attempt or the pair of read operations per read attempt based on the determination of the controller.

3. The system according to claim 2 further comprising an error detection unit configured to evaluate an error level of the single read operation; and
    wherein the controller is configured to determine whether to perform the pair of read operations if the error level exceeds a predefined error threshold.

4. The system according to claim 1, further comprising a decoder configured to hard decode the read outcome.

5. The system according to claim 1, further comprising an error detection unit configured to evaluate an error level of the pair of read operations.

6. The system according to claim 1, wherein the controller is configured to determine a value of at least one bias voltage within a bias voltage valid range based on a retention test based estimation of a threshold voltage distribution of the multiple flash memory cells.

7. A system for reading flash memory cells, the system comprising:
multiple flash memory cells that are arranged in multiple columns and in multiple rows;
a bias voltage unit;
a read unit; and
a controller;
wherein the read unit is configured to:
perform a first read operation of flash memory cells of a certain row of the multiple rows while supplying a read threshold to the flash memory cells of the certain row and while the bias voltage unit supplies a first bias voltage to flash memory cells of other rows of the multiple rows, the other rows differ from the certain row to provide first read results of the flash memory cells of the certain row;
perform a second read operation of flash memory cells of the certain row while supplying the read threshold to the flash memory cells of the certain row while the bias voltage unit supplies to flash memory cells of the other rows a second bias voltage to provide second read results of the flash memory cells of the certain row, wherein the first bias voltage is higher than the second bias voltage, and
provide to the controller a read outcome that is responsive to the first read results and to the second read results;
wherein the read unit is configured to locate a set of non-volatile memory cells that according to the first read results store a zero logic value and according to the second read results store a lowest positive lobe value associated with a lowest positive lobe of a threshold voltage distribution of the non-volatile memory cells; and wherein the read unit is configured to provide a read outcome that associates a lowest positive lobe value with the set of memory non-volatile cells.

8. A system for reading flash memory cells, the system comprising:
multiple flash memory cells that are arranged in multiple columns and in multiple rows;
a bias voltage unit;
a read unit;
an error detection unit; and
a controller;
wherein the read unit is configured to:
perform a first read operation of flash memory cells of a certain row of the multiple rows while supplying a read threshold to the flash memory cells of the certain row and while the bias voltage unit supplies a first bias voltage to flash memory cells of other rows of the multiple rows, the other rows differ from the certain row to provide first read results of the flash memory cells of the certain row;
perform a second read operation of flash memory cells of the certain row while supplying the read threshold to the flash memo cells of the certain row while the bias voltage unit supplies to flash memory cells of the other rows a second bias voltage to provide second read results of the flash memory cells of the certain row, wherein the first bias voltage is higher than the second bias voltage, and
provide to the controller a read outcome that is responsive to the first read results and to the second read results;
wherein the error detection unit is configured to evaluate an error level of the pair of read operations;
wherein the controller is configured to determine, based on the error level of the pair of read operations, whether to perform the pair of read operations per read attempt or to perform soft decoding per each read attempt of the multiple memory cells.

9. The system according to claim 8, wherein the read unit is configured to perform more than a pair of read operations per read attempt to provide multiple read outcomes.

10. A system for reading flash memory cells, the system comprising:
multiple flash memory cells that are arranged in multiple columns and in multiple rows;
a bias voltage unit;
a read unit; and
a controller;
wherein the read unit is configured to:
perform a first read operation of flash memory cells of a certain row of the multiple rows while supplying a read threshold to the flash memory cells of the certain row and while the bias voltage unit supplies a first bias voltage to flash memory cells of other rows of the multiple rows, the other rows differ from the certain row to provide first read results of the flash memory cells of the certain row;
perform a second read operation of flash memory cells of the certain row while supplying the read threshold to the flash memory cells of the certain row while the bias voltage unit supplies to flash memory cells of the other rows a second bias voltage to provide second read results of the flash memory cells of the certain row, wherein the first bias voltage is higher than the second bias voltage, and
provide to the controller a read outcome that is responsive to the first read results and to the second read results;
wherein the bias voltage unit is configured to provide different values of bias voltages during read attempts of different page types, and wherein read attempts of different types relate to different bits out of multiple bits per cell that are stored in each of the multiple flash memory cells.

11. A system for reading flash memory cells, the system comprising:
multiple flash memory cells that are arranged in multiple columns and in multiple rows;
a bias voltage unit;
a read unit; and
a controller;
wherein the read unit is configured to:
perform a first read operation of flash memory cells of a certain row of the multiple rows while supplying a read threshold to the flash memory cells of the certain row and while the bias voltage unit supplies a first bias voltage to flash memory cells of other rows of the multiple rows, the other rows differ from the certain row to provide first read results of the flash memory cells of the certain row;
perform a second read operation of flash memory cells of the certain row while supplying the read threshold to the flash memory cells of the certain row while the bias voltage unit supplies to flash memory cells of the other rows a second bias voltage to provide second read results of the flash memory cells of the certain row, wherein the first bias voltage is higher than the second bias voltage, and
provide to the controller a read outcome that is responsive to the first read results and to the second read results;
wherein the bias voltage unit is configured to provide bias voltages of a first set of values when performing a most significant bit type read operation, and to provide bias voltages of a second set of values when performing a least significant bit type read operation.

12. A system for reading flash memory cells, the system comprising:
multiple flash memory cells that are arranged in multiple columns and in multiple rows;
a bias voltage unit;
a read unit; and
a controller;
wherein the read unit is configured to:
perform a first read operation of flash memory cells of a certain row of the multiple rows while supplying a read threshold to the flash memory cells of the certain row and while the bias voltage unit supplies a first bias voltage to flash memory cells of other rows of the multiple rows, the other rows differ from the certain row to provide first read results of the flash memory cells of the certain row;
perform a second read operation of flash memory cells of the certain row while supplying the read threshold to the flash memory cells of the certain row while the bias voltage unit supplies to flash memory cells of the other rows a second bias voltage to provide second read results of the flash memory cells of the certain row, wherein the first bias voltage is higher than the second bias voltage, and
provide to the controller a read outcome that is responsive to the first read results and to the second read results;
wherein the controller is configured to program the multiple flash memory cells while the bias voltage unit supplies a bias voltage that differs from the first and the second bias voltages.

13. A system for reading flash memory cells, the system comprising:
multiple flash memory cells that are arranged in multiple columns and in multiple rows;
a bias voltage unit;
a read unit; and
a controller;
wherein the read unit is configured to:
perform a first read operation of flash memory cells of a certain row of the multiple rows while supplying a read threshold to the flash memory cells of the certain row and while the bias voltage unit supplies a first bias voltage to flash memory cells of other rows of the multiple rows, the other rows differ from the certain row to provide first read results of the flash memory cells of the certain row;
perform a second read operation of flash memory cells of the certain row while supplying the read threshold to the flash memory cells of the certain row while the bias voltage unit supplies to flash memory cells of the other rows a second bias voltage to provide second read results of the flash memory cells of the certain row, wherein the first bias voltage is higher than the second bias voltage, and
provide to the controller a read outcome that is responsive to the first read results and to the second read results;
wherein the controller is configured to program the multiple flash memory cells while the bias voltage unit supplies a bias voltage that is lower than the first and the second bias voltages.

14. A system for reading flash memory cells, the system comprising:
multiple flash memory cells that are arranged in multiple columns and in multiple rows;
a bias voltage unit;
a read unit; and
a controller;
wherein the read unit is configured to:
perform a first read operation of flash memory cells of a certain row of the multiple rows while supplying a read threshold to the flash memory cells of the certain row and while the bias voltage unit supplies a first bias voltage to flash memory cells of other rows of the multiple rows, the other rows differ from the certain row to provide first read results of the flash memory cells of the certain row;
perform a second read operation of flash memory cells of the certain row while supplying the read threshold to the flash memory cells of the certain row while the bias voltage unit supplies to flash memory cells of the other rows a second bias voltage to provide second read results of the flash memory cells of the certain row, wherein the first bias voltage is higher than the second bias voltage, and
provide to the controller a read outcome that is responsive to the first read results and to the second read results;
wherein the read unit is configured to perform multiple iterations of the first and the second read operations, while the bias voltage unit supplies different bias voltages during different iterations, to provide multiple read outcomes.

15. A non-transitory computer readable medium having stored thereon an executable computer-readable program code for reading flash memory cells that are arranged in multiple rows and multiple columns, the executable computer-readable program when executed by a computer processor performs the steps of:
performing a first read operation of flash memory cells of a certain row of the multiple rows while su e a read threshold to the flash memory cells of the certain row and while supplying a first bias voltage to flash memory cells of other rows of the multiple rows, the other rows differ from the certain row to provide first read results of the flash memory cells of the certain row;
performing a second read operation of flash memory cells of the certain row while supplying the read threshold to the flash memory cells of the certain row and supplying to flash memory cells of the other rows a second bias voltage to the multiple flash memory cells to provide second read results of the flash memory cells of the certain row, wherein the first bias voltage is higher than the second bias voltage; and
providing a read outcome that is responsive to the first read results and to the second read results;
wherein the executable computer-readable program code when executed by a computer processor performs the steps of providing the second read results by comparing a content of the multiple non-volatile memory cells to a first threshold set to zero, and to a second threshold that has a value between a lowest positive lobe and a second lower positive lobe of a threshold voltage distribution of the non-volatile memory cells.

16. The non-transitory computer readable medium according to claim 15 wherein the executable computer-readable program code when executed by a computer processor performs the steps of determining whether a single read operation per read attempt or a pair of read operations per read attempt is to be performed; and performing the single read operation per read attempt or the pair of read operations per read attempt based on the determining.

17. The non-transitory computer readable medium according to claim 15 wherein the executable computer-readable program code when executed by a computer processor performs the step of hard decoding the read outcome.

18. The non-transitory computer readable medium according to claim 15 wherein the executable computer-readable program code when executed by a computer processor performs the step of evaluating an error level of the pair of read operations.

19. The non-transitory computer readable medium according to claim 15 wherein the executable computer-readable program code when executed by a computer processor performs the steps of determining a value of at least one bias voltage within a bias voltage valid range based on a retention test based estimation of a threshold voltage distribution of the multiple flash memory cells.

20. The non-transitory computer readable medium according to claim 16 wherein the executable computer-readable program code when executed by a computer processor performs the steps of evaluating an error level of the single read operation; and determining whether to perform the pair of read operations if the error level exceeds a predefined error threshold.

21. A non-transitory computer readable medium having stored thereon an executable computer-readable program code for reading flash memory cells that are arranged in multiple rows and multiple columns, the executable computer-readable program when executed by a computer processor performs the steps of:
    performing a first read operation of flash memory cells of a certain row of the multiple rows while supplying a read threshold to the flash memory cells of the certain row and while supplying a first bias voltage to flash memory cells of other rows of the multiple rows, the other rows differ from the certain row to provide first read results of the flash memory cells of the certain row;
    performing a second read operation of flash memory cells of the certain row while supplying the read threshold to the flash memory cells of the certain row and supplying to flash memory cells of the other rows a second bias voltage to the multiple flash memory cells to provide second read results of the flash memory cells of the certain row, wherein the first bias voltage is higher than the second bias voltage; and
    providing a read outcome that is responsive to the first read results and to the second read results;
    wherein the executable computer-readable program code when executed by a computer processor performs the steps of locating a set of non-volatile memory cells that according to the first read results store a zero logic value and according to the second read results store a lowest positive lobe value associated with a lowest positive lobe of a threshold voltage distribution of the non-volatile memory cells; and providing a read outcome that associates a lowest positive lobe value with the set of memory non-volatile cells.

22. A non-transitory computer readable medium having stored thereon an executable computer-readable program code for reading flash memory cells that are arranged in multiple rows and multiple columns, the executable computer-readable program when executed by a computer processor performs the steps of:
    performing a first read operation of flash memory cells of a certain row of the multiple rows while supplying a read threshold to the flash memory cells of the certain row and while supplying a first bias voltage to flash memory cells of other rows of the multiple rows, the other rows differ from the certain row to provide first read results of the flash memory cells of the certain row;
    performing a second read operation of flash memory cells of the certain row while supplying the read threshold to the flash memory cells of the certain row and supplying to flash memory cells of the other rows a second bias voltage to the multiple flash memory cells to provide second read results of the flash memory cells of the certain row, wherein the first bias voltage is higher than the second bias voltage; and
    providing a read outcome that is responsive to the first read results and to the second read results;
    wherein the executable computer-readable program code when executed by a computer processor performs the step of evaluating an error level of the pair of read operations;
    wherein the executable computer-readable program code when executed by a computer processor performs the step of determining, based on the error level of the pair of read operations, whether to perform the pair of read operations per read attempt or to perform soft decoding per each read attempt of the multiple memory cells.

23. The non-transitory computer readable medium according to claim 22 wherein the executable computer-readable program code when executed by a computer processor performs the step of performing more than a pair of read operations per read attempt to provide multiple read outcomes.

24. A non-transitory computer readable medium having stored thereon an executable computer-readable program code for reading flash memory cells that are arranged in multiple rows and multiple columns, the executable computer-readable program when executed by a computer processor performs the steps of:
    performing a first read operation of flash memory cells of a certain row of the multiple rows while supplying in a read threshold to the flash memory cells of the certain row and while supplying a first bias voltage to flash memory cells of other rows of the multiple rows, the other rows differ from the certain row to provide first read results of the flash memory cells of the certain row;
    performing a second read operation of flash memory cells of the certain row while supplying the read threshold to the flash memory cells of the certain row and supplying to flash memory cells of the other rows a second bias voltage to the multiple flash memory cells to provide second read results of the flash memory cells of the certain row, wherein the first bias voltage is higher than the second bias voltage; and
    providing a read outcome that is responsive to the first read results and to the second read results;
    wherein the executable computer-readable program code when executed by a computer processor performs the step of providing different values of bias voltages during read attempts of different page types, and wherein read attempts of different types relate to different bits out of multiple bits per cell that are stored in each of the multiple flash memory cells.

25. A non-transitory computer readable medium having stored thereon an executable computer-readable program code for reading flash memory cells that are arranged in multiple rows and multiple columns, the executable computer-readable program when executed by a computer processor performs the steps of:
    performing a first read operation of flash memory cells of a certain row of the multiple rows while supplying a read threshold to the flash memory cells of the certain row and while supplying a first bias voltage to flash memory cells of other rows of the multiple rows, the other rows differ from the certain row to provide first read results of the flash memory cells of the certain row;

performing a second read operation of flash memory cells of the certain row while supplying the read threshold to the flash memory cells of the certain row and supplying to flash memory cells of the other rows a second bias voltage to the multiple flash memory cells to provide second read results of the flash memory cells of the certain row, wherein the first bias voltage is higher than the second bias voltage; and providing a read outcome that is responsive to the first read results and to the second read results;

wherein the executable computer-readable program code when executed by a computer processor performs the steps of providing bias voltages of a first set of values when performing a most significant bit type read operation, and providing bias voltages of a second set of values when performing a least significant bit type read operation.

26. A non-transitory computer readable medium having stored thereon an executable computer-readable program code for reading flash memory cells that are arranged in multiple rows and multiple columns, the executable computer-readable program when executed by a computer processor performs the steps of:

performing a first read operation of flash memory cells of a certain row of the multiple rows while supplying a read threshold to the flash memory cells of the certain row and while supplying a first bias voltage to flash memory cells of other rows of the multiple rows, the other rows differ from the certain row to provide first read results of the flash memory cells of the certain row;

performing a second read operation of flash memory cells of the certain row while supplying the read threshold to the flash memory cells of the certain row and supplying to flash memory cells of the other rows a second bias voltage to the multiple flash memory cells to provide second read results of the flash memory cells of the certain row, wherein the first bias voltage is higher than the second bias voltage; and providing a read outcome that is responsive to the first read results and to the second read results;

wherein the executable computer-readable program code when executed by a computer processor performs the step of programming the multiple flash memory cells while supplying a bias voltage that differs from the first and the second bias voltages.

27. A non-transitory computer readable medium having stored thereon an executable computer-readable program code for reading flash memory cells that are arranged in multiple rows and multiple columns, the executable computer-readable program when executed by a computer processor performs the steps of:

performing a first read operation of flash memory cells of a certain row of the multiple rows while supplying a read threshold to the flash memory cells of the certain row and while supplying a first bias voltage to flash memory cells of other rows of the multiple rows, the other rows differ from the certain row to provide first read results of the flash memory cells of the certain row;

performing a second read operation of flash memory cells of the certain row while supplying the read threshold to the flash memory cells of the certain row and supplying to flash memory cells of the other rows a second bias voltage to the multiple flash memory cells to provide second read results of the flash memory cells of the certain row, wherein the first bias voltage is higher than the second bias voltage; and providing a read outcome that is responsive to the first read results and to the second read results;

wherein the executable computer-readable program code when executed by a computer processor performs the step of programming the multiple flash memory cells while the bias voltage unit supplies a bias voltage that is lower than the first and the second bias voltages.

28. A non-transitory computer readable medium having stored thereon an executable computer-readable program code for reading flash memory cells that are arranged in multiple rows and multiple columns, the executable computer-readable program when executed by a computer processor performs the steps of:

performing a first read operation of flash memory cells of a certain row of the multiple rows while supplying a read threshold to the flash memory cells of the certain row and while supplying a first bias voltage to flash memory cells of other rows of the multiple rows, the other rows differ from the certain row to provide first read results of the flash memory cells of the certain row;

performing a second read operation of flash memory cells of the certain row while supplying the read threshold to the flash memory cells of the certain row and supplying to flash memory cells of the other rows a second bias voltage to the multiple flash memory cells to provide second read results of the flash memory cells of the certain row, wherein the first bias voltage is higher than the second bias voltage; and providing a read outcome that is responsive to the first read results and to the second read results;

wherein the executable computer-readable program code when executed by a computer processor performs the step of performing multiple iterations of the first and the second read operations, while supplying different bias voltages during different iterations, to provide multiple read outcomes.

* * * * *